United States Patent [19]
Iyer

[11] Patent Number: 5,629,246
[45] Date of Patent: May 13, 1997

[54] METHOD FOR FORMING FLUORINE-DOPED GLASS HAVING LOW CONCENTRATIONS OF FREE FLUORINE

[75] Inventor: Ravi Iyer, Boise, Id.

[73] Assignee: Micron Technology, Inc., Boise, Id.

[21] Appl. No.: 534,721

[22] Filed: Sep. 27, 1995

[51] Int. Cl.$^6$ ............ H01L 21/473; H01L 21/4757
[52] U.S. Cl. .................... 438/763; 438/910; 438/784; 427/99
[58] Field of Search .................... 437/238, 240, 437/241, 13, 937, 959, 247; 204/164; 148/DIG. 3, DIG. 15, DIG. 114, DIG. 118, DIG. 40, DIG. 61; 65/30.1, 32.1; 427/543, 557, 535, 99, 585, 588

[56] References Cited

U.S. PATENT DOCUMENTS

| | | | |
|---|---|---|---|
| 4,807,016 | 2/1989 | Douglas | 357/67 |
| 5,094,984 | 3/1992 | Liu et al. | 437/235 |
| 5,334,552 | 8/1994 | Homma | 437/195 |
| 5,382,809 | 1/1995 | Nishibayashi et al. | 257/77 |

OTHER PUBLICATIONS

Laxman, Ravi "Low E Dielectrics: CVD Fluorinated Silicon Dioxides", Semiconductor International, May 1995, 71–74.
Takeishi, S. et al. "Stabilizing Dielectric Constants of Fluorine–Doped–SiO$_2$ Films by N$_2$O–Plasma Annsaling", DUMIC Conference, Feb. 21–22, 1995 pp. 257–259.
Shimokawa, K. "Fluorine Doped SiO$_2$ with Low Dielectric Constant for Multilevel Interconnection", Oki Electric Industry.
Qian, L. "High Density Plasma Deposition and Deep Submicron Gap Fill With Low Dielectric Constant SiOF Films", DUMIC Conference, Feb., 21–22, 1995, pp. 50–56.

*Primary Examiner*—Charles L. Bowers, Jr.
*Assistant Examiner*—Matthew Whippu
*Attorney, Agent, or Firm*—Angus C. Fox, III

[57] ABSTRACT

This invention is a method for forming fluorine-doped silicate glass having low concentrations of free fluorine atoms. A first embodiment of the invention provides simultaneous deposition of the fluorine-doped glass and scavenging of free fluorine atoms from the surface of the depositing material. A silicon-containing compound, an oxidizer, a fluorine containing compound and a hydrogen-containing gas are introduced into a plasma chemical vapor deposition chamber. A fluorine-doped glass layer having low concentrations of free fluorine atoms deposits. A second embodiment of the invention provides for scavenging of free fluorine atoms from an already-deposited fluorine-doped glass layer by annealing the layer in a forming gas containing hydrogen. The hydrogen gas diffuses into the deposited film and reacts with free fluorine atoms. The hydrogen fluoride so formed migrates through the matrix to the surface of the deposited film, where it is released into the ambient. A third embodiment of the invention provides a method for decreasing the amount of free fluorine atoms in an already-deposited fluorine-doped glass layer by depositing a capping layer over the glass layer and annealing the resulting stack. Many of the free fluorine atoms in the layer migrate and react with dangling silicon bonds within the layer. A subsequent anneal with the capping layer removed and in the presence of a forming gas containing hydrogen, as heretofore described, further lowers the concentration of free fluorine atoms.

23 Claims, No Drawings

5,629,246

METHOD FOR FORMING FLUORINE-DOPED GLASS HAVING LOW CONCENTRATIONS OF FREE FLUORINE

FIELD OF THE INVENTION

This invention relates to processes for simultaneously depositing and doping silicon dioxide films and, more particularly, to a process for doping a silicon dioxide film with fluorine as it is deposited and scavenging free fluorine atoms from the film.

BACKGROUND OF THE INVENTION

Doped and undoped silicon dioxides, which are commonly referred to as silicate glasses, are widely used as dielectrics in integrated circuits. Although silicon dioxide possesses a tetrahedral matrix which will impart a crystalline structure to the material under proper heating and cooling conditions, the silicon dioxides used as dielectrics in integrated circuits are typically amorphous materials. Chemical vapor deposition of silicate glasses has become of paramount importance in the manufacture of contemporary integrated circuits. For example, silicate glass doped with both boron and phosphorous is widely used as an inter-level dielectric and as a getter material for mobile sodium ions. As geometries are shrunk in the interest of faster operating speeds and lower manufacturing costs, capacitive coupling between narrowly-spaced conductive layers and structures within the circuits has become a significant performance-limiting problem.

In order to reduce capacitive coupling within integrated circuitry, glasses having lower dielectric constants have been tried. Fluorine-doped glass is particularly interesting because the incorporation of fluorine into the tetrahedral silicon dioxide matrix significantly lowers the dielectric constant of the material. Fluorine-doped glass may be deposited by the plasma reaction of ethyl hexafluoride ($C_2F_6$), methyl tetrafluoride ($CF_4$), or nearly any fluorine-containing compound with tetraethylorthosilicate and diatomic oxygen gas ($O_2$). Films deposited via this technique have proven to be unusable because they characteristically contain free fluorine atoms. In the presence of humidity, these free fluorine atoms leach out of the glass and combine with water molecules to form hydrofluoric acid. As the acid rapidly attacks most metals, with aluminum being particularly vulnerable to attack, it can cause circuit unreliability and failure.

It is the principal object of the present invention to provide an improved method for forming fluorine-doped silicate glasses having low concentrations of free fluorine atoms.

SUMMARY OF THE INVENTION

This invention is embodied in an improved method for forming fluorine-doped silicate glass having low concentrations of free fluorine atoms. A first embodiment of the invention is a single-step plasma deposition process, the second embodiment of the invention is a two-step process requiring both a plasma deposition and a subsequent anneal, and the third embodiment of the invention is a three-step process requiring both a plasma deposition, the deposition of a capping layer on top of the plasma-deposited glass layer, and an anneal of the capped glass layer.

The first embodiment of the invention provides simultaneous deposition of the fluorine-doped glass and scavenging of free fluorine atoms from the surface of the depositing material. A silicon-containing compound such as tetraethylorthosilicate, silane ($SiH_4$) or disilane ($Si_2H_6$); an oxidizer such as oxygen or ozone; a fluorine containing compound such as ethyl hexafluoride or methyl tetrafluoride; and an electropositive reducer gas such as diatomic hydrogen, silane or disilane are introduced into a plasma chemical vapor deposition chamber. Radicals formed from the reducer gas in the plasma environment bond with free fluorine atoms on or below the surface of the depositing glass to form hydrogen fluoride gas, which is pumped out of the reaction chamber on an ongoing basis during the deposition process. A fluorine-doped glass relatively free of free fluorine atoms is deposited.

The second embodiment of the invention provides for scavenging of free fluorine atoms from a deposited fluorine-doped silicate glass by annealing the glass in a forming gas containing an electropositive reducer gas such as diatomic hydrogen. Hydrogen gas diffuses into the deposited film and reacts with free fluorine atoms. Once a free fluorine atom has reacted with hydrogen, the coulombic forces which trapped the free fluorine atom in the silicon dioxide tetrahedral matrix are greatly reduced, and the fluoride compound is able migrate through the matrix to the surface of the deposited film, where it is released into the ambiance.

The third embodiment of the invention provides a method for decreasing the amount of free fluorine atoms in an already-deposited film by forcing many of the free fluorine atoms in the layer to react with dangling silicon bonds within the layer. This is accomplished by depositing a fluorine-impermeable capping layer such as a silicon nitride layer on top of the fluorine-doped oxide film, annealing the multilayer stack at a temperature sufficient to cause free fluorine atoms to be desorbed from the silicon dioxide matrix. During the annealing period, the desorbed free fluorine atoms are free to migrate throughout the silicon dioxide layer and react with dangling silicon bonds that they may encounter. In order to reduce the concentration of free fluorine atoms still further, the capping layer is stripped and the fluorine-doped silicon dioxide layer is annealed in the presence of a forming gas containing an electropositive reducer gas such as diatomic hydrogen, as heretofore described.

DETAILED DESCRIPTION OF THE PREFERRED EMBODIMENT

A first embodiment of the improved method for forming fluorine-doped silicate glass having low concentrations of free fluorine atoms comprises a single-step plasma deposition process. The first embodiment provides simultaneous deposition of the fluorine-doped glass and scavenging of free fluorine atoms from the surface of the depositing material. To this end, a substrate which is typically a silicon wafer having in-process circuitry thereon, is placed within a plasma chemical vapor deposition chamber. The substrate is heated using one of several commonly-known techniques such a heat transfer from a heated wafer support base, infra-red radiation, and the like, to a temperature within a range of about 200°–600° C., with a preferred range being about 400°–450° C. The 600° C. upper limit is dictated by the melting point and electromigration characteristics of aluminum, which is utilized extensively in integrated circuits, as well as by thermal budget considerations which are determined by dispersion limits for dopants. The minimum temperature of 200° C. is dictated by competition between the gas phase reaction and the surface reaction of reactant plasma species present. As substrate temperature decreases, the reaction becomes increasingly homogeneous.

A completely homogeneous reaction is one in which plasma species react with one another in the gas phase to form particulates which settle onto the wafer as dust. As this is definitely an undesirable result, the substrate is maintained within a temperature range which favors a heterogeneous reaction. A completely heterogeneous reaction is one in which plasma species react with one another at the substrate surface. A silicon-containing compound such as tetraethylorthosilicate or silane, an oxidizer such as diatomic oxygen gas or ozone gas, a fluorine containing compound such as ethyl hexafluoride or methyl tetrafluoride, and an electropositive reducer gas such as diatomic hydrogen or silane are introduced into the deposition chamber. During the introduction of reactants into the deposition chamber, the chamber is maintained at a pressure within a range of about 1.0 to 12.0 torr, with a preferred range being 5.0 to 8.0 torr. At pressures less than 1.0 torr, it becomes increasingly difficult to strike a plasma. In addition, at pressures below 5.0 torr, the deposition rate slows considerably. At pressures near 1.0 torr, the deposition rate is unacceptably slow for a production process. As an upper pressure limit of about 12.0 torr is reached, the reaction within the chamber becomes increasingly homogeneous, with the plasma species reacting in the gas phase to form particles. In addition, at chamber pressure of about 12.0 torr, it becomes difficult to strike a plasma. The deposition chamber may employ a plasma source that is either within the chamber or remote from the chamber. The reaction of silicon radicals with oxygen radicals at the surface of the heated substrate produces a deposition of silicate glass on the substrate surface. Some of the fluorine radicals produced in the plasma from the fluorine-containing compound are incorporated into the tetrahedral silicon dioxide matrix of the silicate glass as it deposits, being chemically bound to the oxygen atoms of the matrix. Other fluorine radicals are trapped by coulombic forces within the matrix without being chemically bound thereto. Radicals formed from the electropositive reducer gas in the plasma environment bond with these free fluorine radicals whether on or below the surface of the depositing glass to form a fluoride gas, which is pumped out of the reaction chamber on an ongoing basis during the deposition process. The hydrogen radicals are able to diffuse into the depositing glass material and are thus able to react with free fluorine radicals which are trapped below the surface. A fluorine-doped glass relatively free of free fluorine atoms is deposited.

A second embodiment of the invention is a multi-step process in which a fluorine-doped silicate glass layer is deposited using the conventional process of reacting tetraethylorthosilicate, diatomic oxygen and a fluorine-containing compound. The glass layer is then annealed in a forming gas containing an electropositive reducer gas such as diatomic hydrogen gas for at least 10 minutes at a temperature within a range of 100°–500° C., with the preferred range being about 400° to 450° C. for a period of about 30 minutes. For this embodiment of the invention, the temperature limits are dictated—on the high end—by the melting point and electromigration characteristics of aluminum, and by thermal budget considerations which are determined by acceptable dispersion limits for dopants, and—on the low end—by the need for a conveniently rapid reaction. The pressure range for this reaction is set only by the need for a conveniently rapid reaction, as the speed of the reaction slows as the partial pressure of the reducer gas approaches zero. The reducer gas diffuses into the deposited film and reacts with free fluorine atoms which are not chemically bound to oxygen atoms within the tetrahedral silicon dioxide matrix. Once the free fluorine has reacted with the atoms of the reducer gas, the coulombic forces which trapped the free fluorine atom in the tetrahedral matrix are greatly reduced, and the resultant fluoride compound is able to migrate through the matrix to the surface of the deposited film, where it is released into the ambiance. A fluorine-doped glass that is relatively free of free fluorine atoms results from this annealing process.

A third embodiment of the invention provides a method for decreasing the amount of free fluorine atoms in a deposited film by inducing many of the free fluorine atoms in the fluorine-doped silicon dioxide layer to react with dangling silicon bonds within the same layer. This is accomplished by depositing a fluorine-impermeable capping layer (e.g., a silicon nitride layer) on top of the fluorine-doped oxide film, annealing the multi-layer stack at a temperature within a range of about 200° to 600° C. for at least 10 minutes and as much as 90 minutes, with the preferred range being about 400°–450° C., for a period of about 30 minutes so that free fluorine atoms are desorbed from the silicon dioxide matrix. During the annealing period, the desorbed free fluorine atoms are free to migrate throughout the silicon dioxide layer and react with dangling silicon bonds that they may encounter. In order to reduce the concentration of free fluorine atoms still further, the capping layer is stripped and the fluorine-doped silicon dioxide layer is annealed in a forming gas containing an electropositive reducer gas such as diatomic hydrogen for at least 10 minutes at a temperature within a range of 100°–500° C., with the preferred range being about 400° to 450° C. for a period of about 30 minutes. This anneal step was heretofore described for the second embodiment of the invention.

Although only several embodiments of the invention are disclosed herein, it will be obvious to those having ordinary skill in the art of semiconductor integrated circuit fabrication that changes and modifications may be made thereto without departing from the scope and the spirit of the invention as hereinafter claimed.

I claim:

1. A method for reducing concentrations of free fluorine atoms in a fluorine-doped glass layer, said method comprising the steps of:

depositing a capping layer on top of the fluorine-doped glass layer in order to form a capped fluorine-doped glass layer, said capping layer being substantially impermeable to free fluorine atoms;

placing the capped fluorine-doped glass layer in an anneal furnace chamber; and heating the capped glass layer so as to induce free fluorine atoms within the glass layer to react with dangling silicon bonds within the glass layer.

2. The method of claim 1, wherein the capped fluorine-doped glass layer is maintained within a temperature range of 200° to 600° C. during the heating step.

3. The method of claim 1, wherein the capping layer comprises silicon nitride.

4. The method of claim 1, wherein the heating step is continued for a period within a range of about 30–90 minutes.

5. A method fix reducing concentrations of free fluorine atoms in a fluorine-doped glass layer having both free fluorine atoms and dangling silicon bonds, said method comprising the steps of:

depositing a cupping layer on top of the fluorine-doped glass layer in order to form a capped fluorine-doped glass layer, said capping layer acting to confine free fluorine atoms within the glass layer; and heating the capped glass layer for a period sufficient to induce at least a portion of the dangling silicon bonds to react with free fluorine atoms within the glass layer.

6. The method of claim 5, wherein the period is at least 10 minutes.

7. The method of claim 5, wherein the capping layer is silicon nitride.

8. The method of claim 7, wherein the capping layer comprises silicon nitride.

9. The method of claim 5, wherein the capped glass layer is heated to between 200° and 500° C. for a period of at least 10 minutes.

10. A method for reducing concentrations of free fluorine atoms in a fluorine-doped glass layer, said method comprising the steps of:

(a) depositing a capping layer on top of the fluorine-doped glass layer; and (b) annealing the glass layer while it is covered with the capping layer.

11. The method of claim 10, wherein the capping layer comprises silicon nitride.

12. The method of claim 10, wherein the annealing of the glass layer while it is covered with the capping layer is performed at a temperature within a range of about 200°–600° C.

13. The method of claim 12, wherein the annealing of the glass layer while it is covered with the capping layer is performed for a period of at least 10 minutes.

14. The method of claim 5, wherein the capped glass layer is maintained within a temperature range of about 400° to 450° C. for about 30 minutes.

15. The process of claim 7, which further comprises the steps of:

removing the capping layer in order to form an uncapped fluorine-doped glass layer;

placing the uncapped glass layer in an ambiance containing an electropositive reducer gas; and heating the uncapped glass layer to a temperature sufficient to induce the electropositive reducer gas to react with at least a portion of any remaining free fluorine atoms within the uncapped layer to form a fluoride containing gas.

16. The process of claim 15, wherein the uncapped glass layer is heated between 100° and 500° C. for at least 10 minutes.

17. The process of claim 15, wherein the uncapped glass layer is heated to between about 400° and 450° C. for about 30 minutes.

18. The process of claim 15, wherein the fluoride containing gas diffuses from the uncapped silicon dioxide layer into the ambiance.

19. The process of claim 15, wherein said electropositive reducer gas is hydrogen gas.

20. The method of claim 1, which further comprises the steps of:

stripping the capping layer following the heating step to expose the fluorine-doped silicon dioxide layer; and annealing the exposed silicon dioxide layer in an ambiance containing an electropositive reducer gas.

21. The method of claim 20, wherein the exposed fluorine-doped silicon dioxide layer is annealed at temperatures within a range of 100° to 500° C. for at least 10 minutes.

22. The method of claim 20, wherein the exposed fluorine-doped silicon dioxide layer is annealed at temperatures within a range of about 400° to 450° C. for about 30 minutes.

23. The method of claim 20, wherein the electropositive reducer gas is hydrogen gas.

* * * * *